(12) United States Patent
Syu et al.

(10) Patent No.: US 10,993,346 B2
(45) Date of Patent: Apr. 27, 2021

(54) ELECTRONIC DEVICE CAPABLE OF INSTALLING DIFFERENT MODULES AND CASE MODULE THEREOF

(71) Applicant: Wistron Corporation, New Taipei (TW)

(72) Inventors: Yi-Sing Syu, New Taipei (TW); Fu-Chieh Hsu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/693,362

(22) Filed: Nov. 24, 2019

(65) Prior Publication Data

US 2021/0037668 A1  Feb. 4, 2021

(30) Foreign Application Priority Data

Jul. 29, 2019 (TW) .................................. 108126829

(51) Int. Cl.

| | |
|---|---|
| *H05K 7/00* | (2006.01) |
| *H05K 7/14* | (2006.01) |
| *H01R 12/72* | (2011.01) |
| *H01R 25/00* | (2006.01) |

(52) U.S. Cl.
CPC ........... *H05K 7/1424* (2013.01); *H01R 12/72* (2013.01); *H01R 25/006* (2013.01); *H05K 7/1402* (2013.01); *H05K 7/1418* (2013.01)

(58) Field of Classification Search
None
See application file for complete search history.

(56) References Cited

U.S. PATENT DOCUMENTS

| | | | | |
|---|---|---|---|---|
| 5,277,615 A | * | 1/1994 | Hastings | G06F 1/181 361/679.32 |
| 5,340,340 A | * | 8/1994 | Hastings | G06F 1/181 312/223.1 |
| 5,673,171 A | * | 9/1997 | Varghese | G11B 33/08 248/615 |
| 5,673,172 A | * | 9/1997 | Hastings | G06F 1/182 361/679.34 |
| 6,201,692 B1 | * | 3/2001 | Gamble | G11B 33/126 312/223.3 |
| 6,238,026 B1 | * | 5/2001 | Adams | G06F 1/184 312/223.2 |
| 6,293,636 B1 | * | 9/2001 | Le | G06F 1/184 292/DIG. 37 |

(Continued)

*Primary Examiner* — Anthony Q Edwards
*Assistant Examiner* — Rashen E Morrison
(74) *Attorney, Agent, or Firm* — Winston Hsu

(57) ABSTRACT

A case module that is capable of installing a first electronic module and a second electronic module, includes a cage and a restraining component. The first electronic module can move relative to the cage to a first installation position along a first direction. The second electronic module can move relative to the cage to a second installation position along a second direction perpendicular to the first direction. When the first electronic module moves relative to the cage toward the first installation position along the first direction, the restraining component is driven to move relative to the cage toward a restraining position along the first direction. The second electronic module can be stopped by the restraining component when the restraining component is located at the restraining position.

20 Claims, 11 Drawing Sheets

(56) References Cited

U.S. PATENT DOCUMENTS

| | | | |
|---|---|---|---|
| 6,373,695 B1 * | 4/2002 | Cheng | G06F 1/184 312/223.1 |
| 6,456,489 B1 * | 9/2002 | Davis | G06F 1/184 312/332.1 |
| 6,464,085 B1 * | 10/2002 | Chin | G11B 33/128 211/26 |
| 6,616,106 B1 * | 9/2003 | Dean | G06F 1/184 248/27.1 |
| 6,978,903 B2 * | 12/2005 | Son | G06F 1/184 211/26 |
| 7,052,306 B2 * | 5/2006 | Ishigami | G02B 6/4201 439/372 |
| 7,460,365 B2 * | 12/2008 | Morris | G06F 1/187 361/679.33 |
| 7,513,693 B2 * | 4/2009 | Wang | G02B 6/3897 385/56 |
| 7,523,901 B2 * | 4/2009 | Wu | G11B 33/128 211/162 |
| 8,054,624 B2 * | 11/2011 | Chen | G06F 1/187 361/679.37 |
| 8,385,076 B2 * | 2/2013 | Peng | H05K 7/1401 361/740 |
| 8,605,440 B2 * | 12/2013 | Gong | H05K 7/1409 361/726 |
| 9,058,850 B2 * | 6/2015 | Hsiao | G11B 33/128 |
| 9,207,709 B2 * | 12/2015 | Xie | G06F 1/187 |
| 9,706,675 B2 * | 7/2017 | Hartman | H05K 7/1402 |
| 2003/0171016 A1 * | 9/2003 | Bright | H05K 9/0015 439/160 |
| 2005/0141827 A1 * | 6/2005 | Yamada | G02B 6/4261 385/92 |
| 2010/0079936 A1 | 4/2010 | Bridges | |
| 2012/0275120 A1 * | 11/2012 | Nguyen | G02B 6/4284 361/747 |
| 2013/0279129 A1 * | 10/2013 | Xie | G06F 1/16 361/752 |
| 2014/0198434 A1 * | 7/2014 | Ho | G06F 1/187 361/679.01 |

\* cited by examiner

ELECTRONIC DEVICE CAPABLE OF INSTALLING DIFFERENT MODULES AND CASE MODULE THEREOF

BACKGROUND OF THE DISCLOSURE

1. Field of the Disclosure

The present disclosure relates to an electronic device and a case module thereof, and more particularly, to an electronic device capable of installing different modules, and a case module thereof.

2. Description of the Prior Art

With advancement of technology and development of economy, there is increasing demand for high performance electronic devices. However, it consumes more energy with the higher performance of the electronic device. A conventional electronic device usually uses multiple power supply devices and a power distribution module to provide a stable and reliable power supply for other components within the electronic device. However, when the user installs or removes a power supply device and a power distribution module, parts of the power supply device or the power distribution module, such as electrical connectors, might be easily damaged due to an improper installation or removal sequence. For example, the electrical connectors might be damaged by collision due to the improper installation sequence. Furthermore, due to limited internal space of an electronic device, it becomes an important topic to effectively utilize the internal space of the electronic device by adjusting configuration of power supply devices and a power distribution module.

SUMMARY OF THE DISCLOSURE

Therefore, it is an objective of the present disclosure to provide an electronic device capable of installing different modules, and a case module thereof for solving the aforementioned problems.

In order to achieve the aforementioned objective, the present disclosure discloses an electronic device capable of installing different modules. The electronic device includes a case module, at least one first electronic module and a second electronic module. The case module includes a cage and at least one restraining component. The at least one restraining component is movably disposed on the cage and movable relative to the cage to a restraining position along a first direction. The at least one first electronic module is detachably installed on the cage and movable relative to the cage to a first installing position along the first direction. The second electronic module is detachably installed on the cage and movable relative to the cage to a second installing position along a second direction perpendicular to the first direction. The at least one restraining component is driven by the at least one first electronic module to move to the restraining position when the at least one first electronic module moves to the first installing position along the first direction, and the second electronic module is stopped by the at least one restraining component at the restraining position.

According to an embodiment of the present disclosure, the at least one restraining component includes a driving portion, and when the at least one first electronic module is installed on the cage and moves relative to the cage toward the first installing position along the first direction, the driving portion contacts the at least one first electronic module, so that the at least one restraining component is driven by the at least one first electronic module to move toward the restraining position.

According to an embodiment of the present disclosure, the second electronic module includes an abutting portion. The at least one restraining component includes a stopping portion. When the second electronic module has not yet been installed on the cage, the at least one restraining component is allowed to be moved to the restraining position by the at least one first electronic module to allow the stopping portion to contact the abutting portion during movement of the second electronic module to the second installing position along the second direction for preventing the second electronic module from reaching the second installing position along the second direction.

According to an embodiment of the present disclosure, the second electronic module includes at least one engaging portion. The at least one restraining component includes a stopping portion. When the second electronic module is installed on the cage and moves relative to the cage to the second installing position along the second direction, the at least one restraining component is allowed to be moved to the restraining position by the at least one first electronic module to engage the stopping portion with the at least one engaging portion for preventing the second electronic module from leaving from the second installing position along a direction opposite to the second direction.

According to an embodiment of the present disclosure, the cage further includes at least one first guiding component. The second electronic module includes at least one second guiding component, and the second electronic module is guided by cooperation of the at least one first guiding component and the at least one second guiding component to move relative to the cage along the second direction.

According to an embodiment of the present disclosure, the at least one first guiding component is a guiding track. The at least one second guiding component is a guiding slot. The guiding slot includes a slot portion and a diverging opening portion connected to the slot portion and for guiding the guiding track to enter into the slot portion.

According to an embodiment of the present disclosure, the case module further includes at least one recovering component connected to the at least one restraining component and the cage.

According to an embodiment of the present disclosure, a plurality of fixing lugs protrudes from the cage. A plurality of recesses is formed on the at least one restraining component and located at a position corresponding to the plurality of fixing lugs, and the at least one restraining component is movably disposed on the cage by cooperation of the plurality of fixing lugs and the plurality of recesses.

According to an embodiment of the present disclosure, at least one sliding slot is formed on the cage. The at least one restraining component includes a sliding stopping portion located at a position corresponding to the at least one sliding slot. The sliding stopping portion is slidably disposed in the at least one sliding slot when the at least one restraining component is movably disposed on the cage, and the sliding stopping portion is for abutting against a wall of the at least one sliding slot for restraining a sliding displacement of the at least one restraining component.

According to an embodiment of the present disclosure, the electronic device further includes a circuit board. The at least one first electronic module includes a first electrical connector. The second electronic module includes at least one second electrical connector and a third electrical connector. The circuit board includes a fourth electrical connector, and the first electrical connector and the third electrical connector are respectively connected to the at least one second electrical connector and the fourth electrical connector when the at least one first electronic module and the second electronic module are respectively located at the first installing position and the second installing position.

According to an embodiment of the present disclosure, the second electronic module includes an abutting portion and at least one engaging portion. The at least one restraining component includes a stopping portion. When the second electronic module has not yet been installed on the cage, the at least one restraining component is allowed to be moved to the restraining position by the at least one first electronic module to allow the stopping portion to contact the abutting portion during movement of the second electronic module relative to the cage toward the second installing position along the second direction for preventing the second electronic module from reaching the second installing position along the second direction, and when the second electronic module is installed on the cage and moves relative to the cage to the second installing position along the second direction, the at least one restraining component is allowed to be moved to the restraining position by the at least one first electronic module to engage the stopping portion with the at least one engaging portion for preventing the second electronic module from leaving from the second installing position along a direction opposite to the second direction.

In order to achieve the aforementioned objective, the present disclosure further discloses a case module for disposing at least one first electronic module and a second electronic module. The case module includes a cage and at least one restraining component. The at least one restraining component is movably disposed on the cage and movable relative to the cage to a restraining position along a first direction. The at least one first electronic module and the second electronic module are detachably installed on the cage. The at least one first electronic module is movable relative to the cage to a first installing position along the first direction. The second electronic module is movable relative to the cage to a second installing position along a second direction perpendicular to the first direction. The at least one restraining component is driven by the at least one first electronic module to move to the restraining position when the at least one first electronic module moves to the first installing position along the first direction, and the second electronic module is stopped by the at least one restraining component at the restraining position.

According to an embodiment of the present disclosure, the at least one restraining component includes a driving portion, and when the at least one first electronic module is installed on the cage and moves relative to the cage toward the first installing position along the first direction, the driving portion contacts the at least one first electronic module, so that the at least one restraining component is driven by the at least one first electronic module to move toward the restraining position.

According to an embodiment of the present disclosure, the at least one restraining component includes a stopping portion. When the second electronic module has not yet been installed on the cage, the at least one restraining component is allowed to be moved to the restraining position by the at least one first electronic module to allow the stopping portion to contact an abutting portion of the second electronic module during movement of the second electronic module to the second installing position along the second direction for preventing the second electronic module from reaching the second installing position along the second direction.

According to an embodiment of the present disclosure, the at least one restraining component includes a stopping portion. When the second electronic module is installed on the cage and moves relative to the cage to the second installing position along the second direction, the at least one restraining component is allowed to be moved to the restraining position by the at least one first electronic module to engage the stopping portion with at least one engaging portion of the second electronic module for preventing the second electronic module from leaving from the second installing position along a direction opposite to the second direction.

According to an embodiment of the present disclosure, the cage further includes at least one first guiding component for guiding the second electronic module to move relative to the cage along the second direction.

According to an embodiment of the present disclosure, the case module further includes at least one recovering component connected to the at least one restraining component and the cage.

According to an embodiment of the present disclosure, a plurality of fixing lugs protrudes from the cage. A plurality of recesses is formed on the at least one restraining component and located at a position corresponding to the plurality of fixing lugs, and the at least one restraining component is movably disposed on the cage by cooperation of the plurality of fixing lugs and the plurality of recesses.

According to an embodiment of the present disclosure, at least one sliding slot is formed on the cage. The at least one restraining component includes a sliding stopping portion located at a position corresponding to the at least one sliding slot. The sliding stopping portion is slidably disposed in the at least one sliding slot when the at least one restraining component is movably disposed on the cage, and the sliding stopping portion is for abutting against a wall of the at least one sliding slot for restraining a sliding displacement of the at least one restraining component.

According to an embodiment of the present disclosure, the at least one restraining component includes a stopping portion. When the second electronic module has not yet been installed on the cage, the at least one restraining component is allowed to be moved to the restraining position by the at least one first electronic module to allow the stopping portion to contact an abutting portion of the second electronic module during movement of the second electronic module relative to the cage toward the second installing position along the second direction for preventing the second electronic module from reaching the second installing position along the second direction, and when the second electronic module is installed on the cage and moves relative to the cage to the second installing position along the second direction, the at least one restraining component is allowed to be moved to the restraining position by the at least one first electronic module to engage the stopping portion with at least one engaging portion of the second electronic module for preventing the second electronic module from leaving from the second installing position along a direction opposite to the second direction.

In summary, the present invention can effectively utilizes an internal space of the case module by installing the first electronic module and the second electronic module on the cage along different directions. Therefore, the present invention has a better space utilization. Besides, the present invention further utilizes the restraining component which can be driven by the first electronic module to move between the restraining position for stopping the second electronic module, and the releasing position for not stopping the second electronic module. If the user would like to install the first electronic module on the cage and move the first electronic module to the first installing position along the first direction before installing the second electronic module to the second installing position, the restraining component which is driven by the first electronic module to move to the restraining position can stop the second electronic module during the movement of the second electronic module relative to the cage toward the second installing position along the second direction, so that the second electronic module can be restrained from contacting with the first electronic module for preventing collision of components of the first electronic module, e.g., the first electrical connector, and the components of the second electronic module, e.g., the second electrical connector. In other words, the present invention only allows the user to complete the installation of the second electronic module before installation of the first electronic module. Furthermore, if the user would like to detach the second electronic module from the cage before detachment of the first electronic module, the restraining component at the restraining position also can stop the second electronic module to restrain the second electronic module from moving away from the second installing position along the fourth direction for preventing the first electrical connector and the second electrical connector which are mated with each other from being damaged by an external force. In other words, the present invention only allows the user to complete detachment of the first electronic module before detachment of the second electronic module. That is, the present invention can effectively prevent the first electronic module or the second electronic module from being damaged by a collision due to an operational mistake during installation or detachment.

These and other objectives of the present disclosure will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the disclosure may be practiced. In this regard, directional terminology, such as "top," "bottom," "front," "back," etc., is used with reference to the orientation of the Figure(s) being described. The components of the present disclosure can be positioned in a number of different orientations. As such, the directional terminology is used for purposes of illustration and is in no way limiting. Accordingly, the drawings and descriptions will be regarded as illustrative in nature and not as restrictive.

Figure 1:
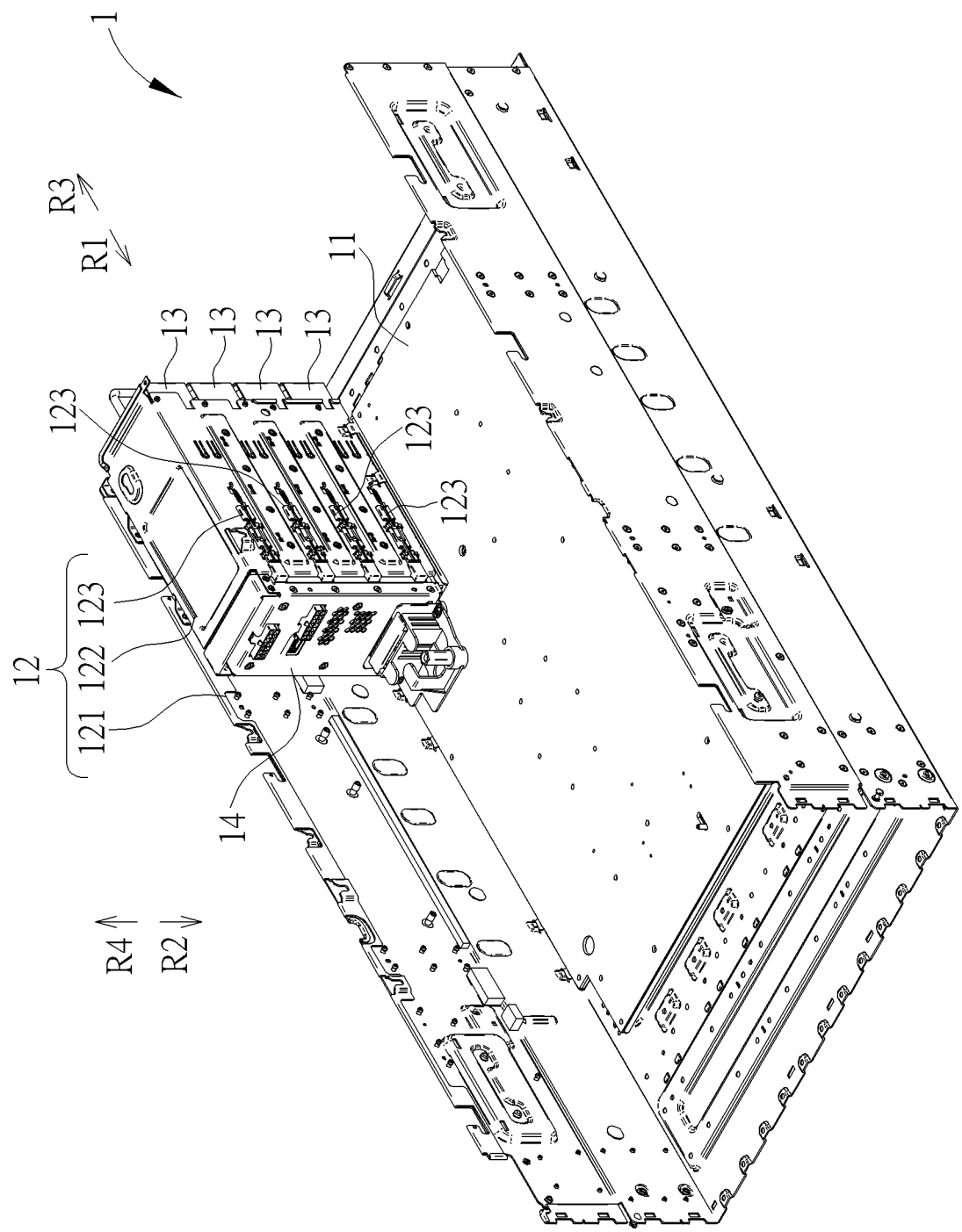
FIG. 1 is a partial diagram of an electronic device according to an embodiment of the present disclosure.
Figure 2:
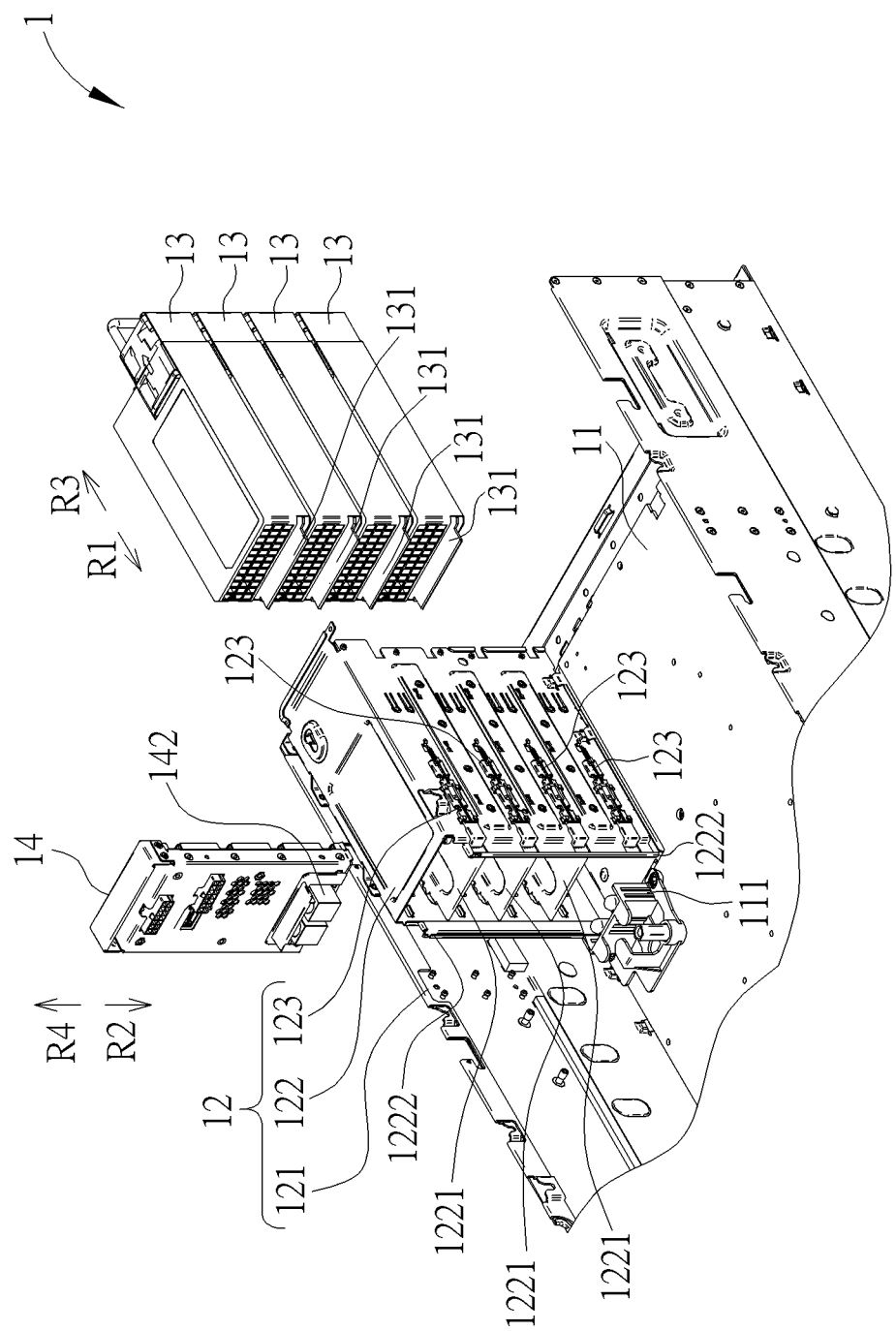
FIG. 2 and FIG. 3 are partial exploded diagrams of the electronic device at different views according to the embodiment of the present disclosure.
Figure 3:
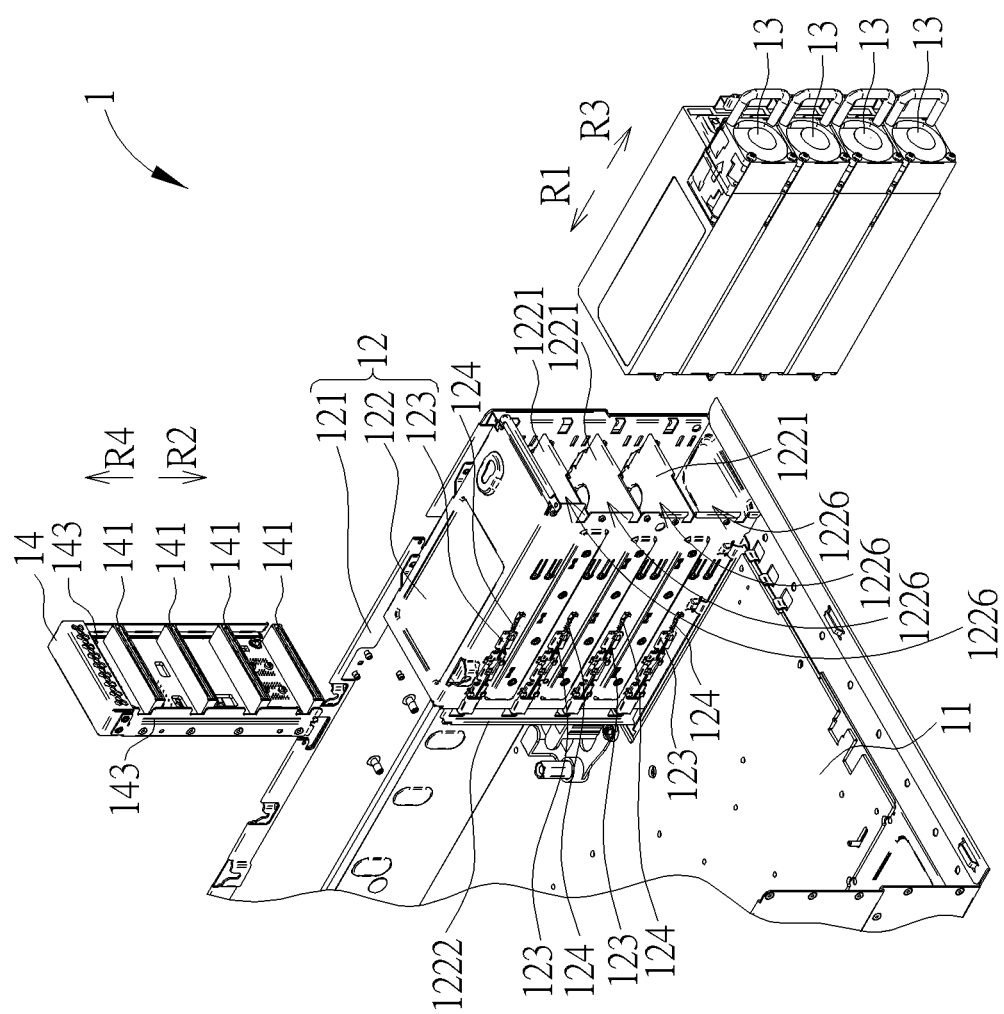

Please refer to FIG. 1 to FIG. 3. FIG. 1 is a partial diagram of an electronic device 1 according to an embodiment of the present disclosure. FIG. 2 and FIG. 3 are partial exploded diagrams of the electronic device 1 at different views according to the embodiment of the present disclosure. FIG. 1 to FIG. 3 illustrate part of components of the electronic device 1. As shown FIG. 1 to FIG. 3, the electronic device 1 includes a circuit board 11, a case module 12, four first electronic modules 13 and a second electronic module 14. Each first electronic module 13 includes a first electrical connector 131. The second electronic module 14 includes four second electrical connectors 141 and a third electrical connector 142. The circuit board 11 includes a fourth electrical connector 111. When the first electrical connector 131 of each first electronic module 13 and the third electrical connector 142 of the second electronic module 14 are respectively electrically connected to the corresponding second electrical connector 142 of the second electronic module 14 and the fourth electrical connector 111 of the circuit board 11, each first electronic module 13 can be electrically connected to the circuit board 11 by the second electronic module 14, in order for signal transmission and/or electricity transmission between each first electronic module 13 and the circuit board 11. In this embodiment, the electronic device 1 can be a computer device, a work station or a server. Each first electronic module 13 can be a power supply module. The second electronic module 14 can be a power distribution module. The power supply module can provide the circuit board 11 with electricity by the power distribution module. However, the present disclosure is not limited to this embodiment. For example, in another embodiment, each first electronic module can be a hard disk, and the second electronic module can be a redundant array of inexpensive disks, RAID, for connecting the multiple hard disks. Besides, the numbers of the first electronic module and the second electronic module are not limited to this embodiment, and it depends on practical demands. For example, in another embodiment, the electronic device can include only one first electronic module.

The case module 12 includes an outer case 121, a cage 122 and four restraining components 123. The circuit board 11 is disposed on an inner side of the outer case 121. The cage 122 is disposed inside the outer case 121. Each restraining component 123 is movably disposed on the cage 122 and can move relative to the cage 122 to a restraining position as shown in FIG. 1 along a first direction R1 or move from the restraining position to a releasing position as shown in FIG. 2 along a direction, i.e., a third direction R3, opposite to the first direction R1. Each first electronic module 13 is detachably installed on the cage 112 and can move relative to the cage 122 to a first installing position as shown in FIG. 1 along the first direction R1 or leave from the first installing position along the third direction R3 opposite to the first direction R1. The second electronic module 14 is detachably installed on the cage 122 and can move relative to the cage 122 to a second installing position as shown in FIG. 1 along a second direction R2 substantially perpendicular to the first direction R1 or leave from the second installing position along a direction, i.e., a fourth direction R4, opposite to the second direction R2.

Furthermore, when the second electronic module 14 is located at the second installing position, the third electrical connector 142 of the second electronic module 14 is mated with the fourth electrical connector 111 of the circuit board 11, so that the second electronic module 14 is electrically connected to the circuit board 11. When the second electronic module 14 and the first electronic module 13 are respectively located at the second installing position and the first installing position, the third electrical connector 142 of the second electronic module 14 and the first electrical connector 131 of each first electronic module 13 are respectively mated with the fourth electrical connector 111 of the circuit board 11 and the corresponding second electrical connector 141 of the second electronic module 14, so that the first electronic module 13 is electrically connected to the circuit board 11 by the second electronic module 14. Besides, the number of the restraining component is not limited to this embodiment. It depends on practical demands. For example, in another embodiment, the electronic device can include only one restraining component.

Figure 4:
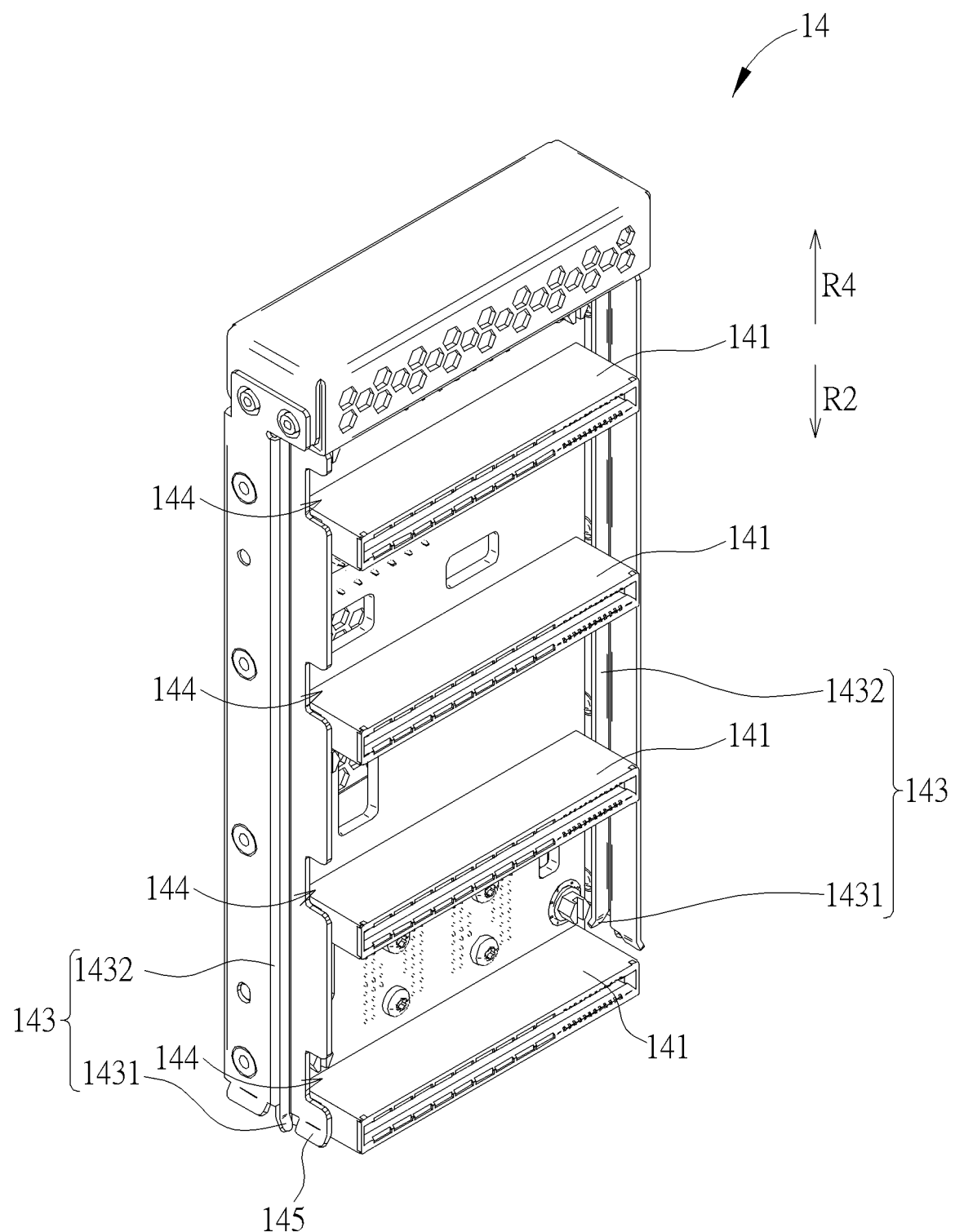
FIG. 4 is a diagram of a second electronic module according to the embodiment of the present disclosure.
Figure 5:
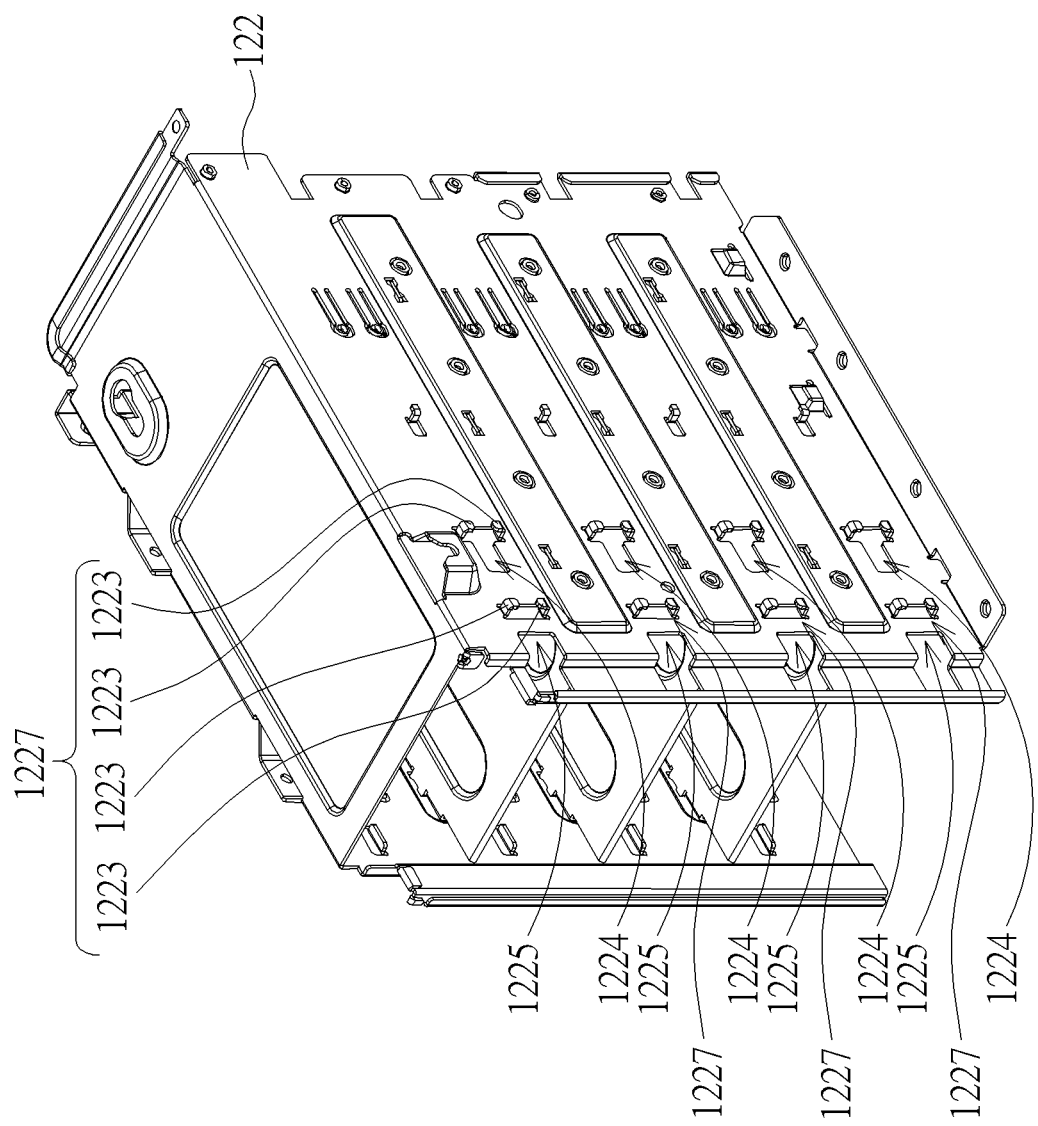
FIG. 5 and FIG. 6 are diagrams of a cage at different views according to the embodiment of the present disclosure.
Figure 6:
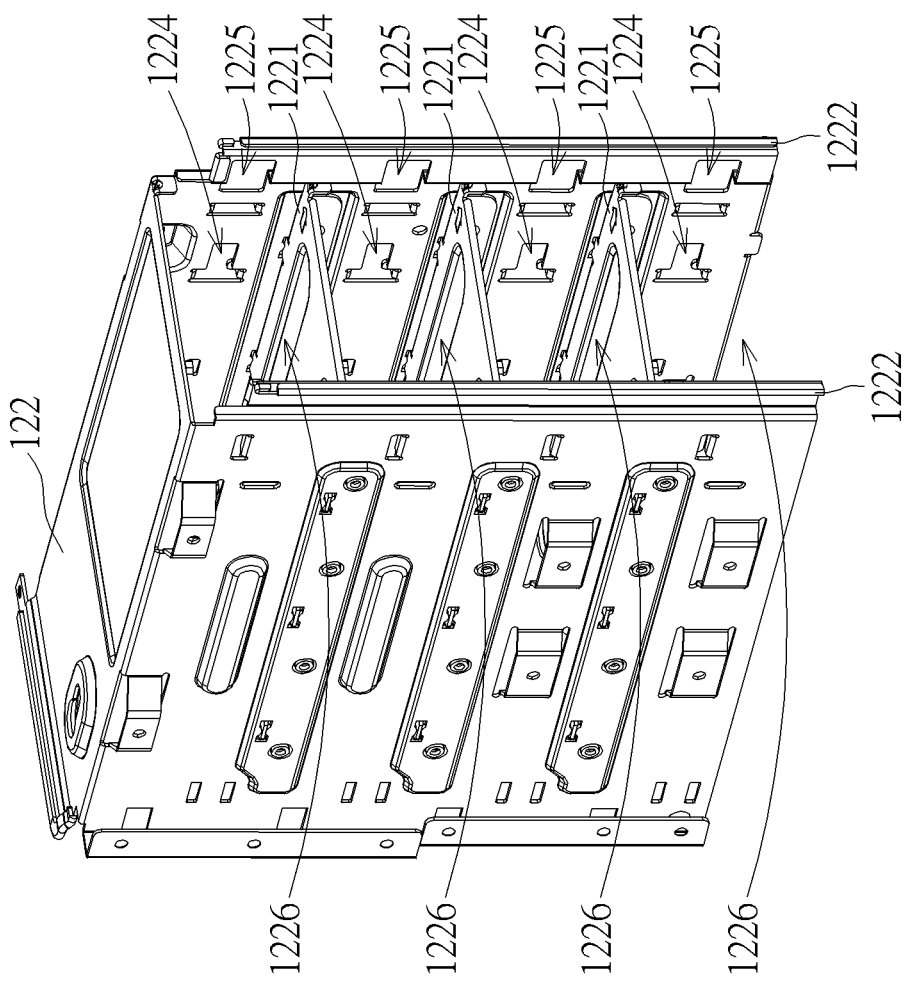

Specifically, please refer to FIG. 1 to FIG. 6. FIG. 4 is a diagram of the second electronic module 14 according to the embodiment of the present disclosure. FIG. 5 and FIG. 6 are diagrams of the cage 122 at different views according to the embodiment of the present disclosure. As shown in FIG. 1 to FIG. 6, the cage 122 includes three partition components 1221 for dividing an internal space of the cage 122 into four accommodating spaces 1226. The three partition components 1221 can be parallel to one another. The four accommodating spaces 1226 are for accommodating the four first electronic modules 13, respectively. Each partition component 1221 extends along a direction substantially parallel to the first direction R1 and the third direction R3. Each partition component 1221 can be used for guiding the corresponding first electronic module 13 relative to the cage 122 to move along the first direction R1 or the third direction R3 when each first electronic module 13 enters into or departs from the corresponding accommodating space 1226. Furthermore, the cage 122 further includes two first guiding components 1222. The second electronic module 14 includes two second guiding components 143. Each first guiding component 1222 and each second guiding component 143 extend along a direction substantially parallel to the second direction R2 and the fourth direction R4. The second electronic module 14 can be guided by cooperation of the two first guiding components 1222 and the two second guiding components 143 to move relative to the cage 122 along the second direction R2 or the fourth direction R4.

Preferably, in this embodiment, each partition component 1221 can be a shelf component. Each first guiding component 1222 can be a guiding track. Each second guiding component 143 can be a guiding slot structure. Each second guiding component 143 includes a diverging opening portion 1431 and a slot portion 1432. The diverging opening portion 1431 is connected to the slot portion 1432 and for guiding the guiding track, i.e., the first guiding component, to enter into the slot portion 1432. However, the present disclosure is not limited to this embodiment. For example, in another embodiment, the first guiding component can be a roller assembly. The roller assembly includes a plurality of rollers arranged along a direction substantially parallel to the second direction and the fourth direction. The second guiding component can be a guiding track. In other words, the second electronic module can be guided by cooperation of the roller assembly and the guiding track to move relative to the cage along the second direction or the fourth direction.

Figure 7:
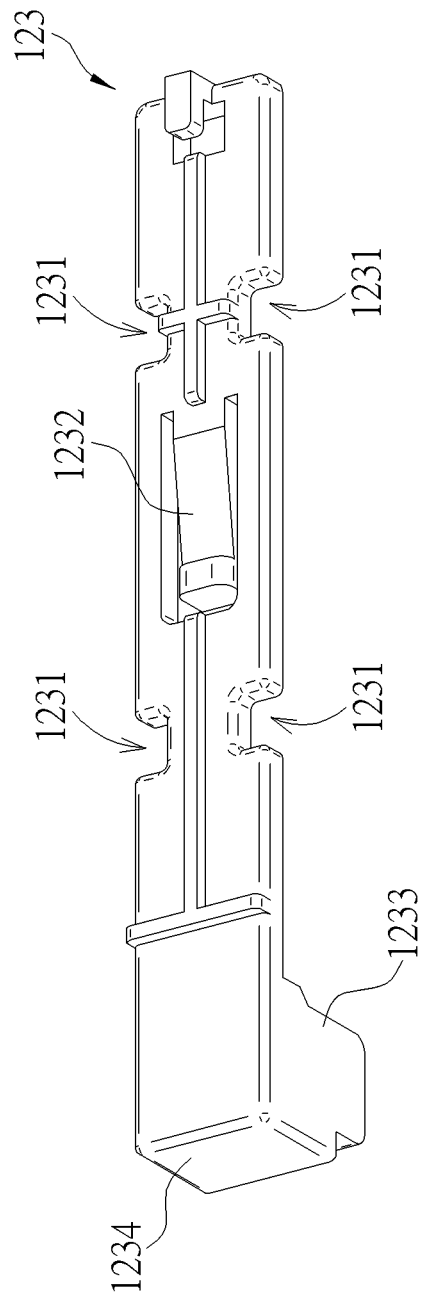
FIG. 7 and FIG. 8 are diagrams of a restraining component at different views according to the embodiment of the present disclosure.
Figure 8:
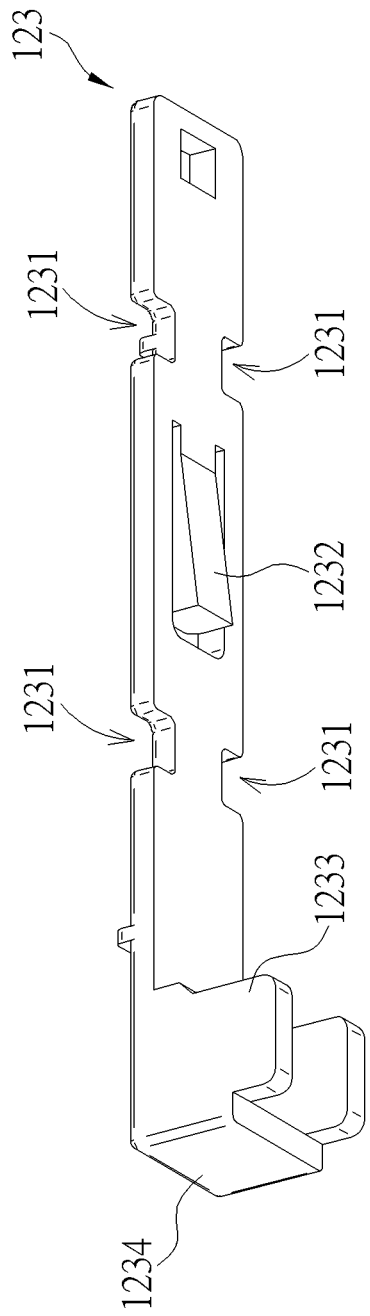
Figure 9:
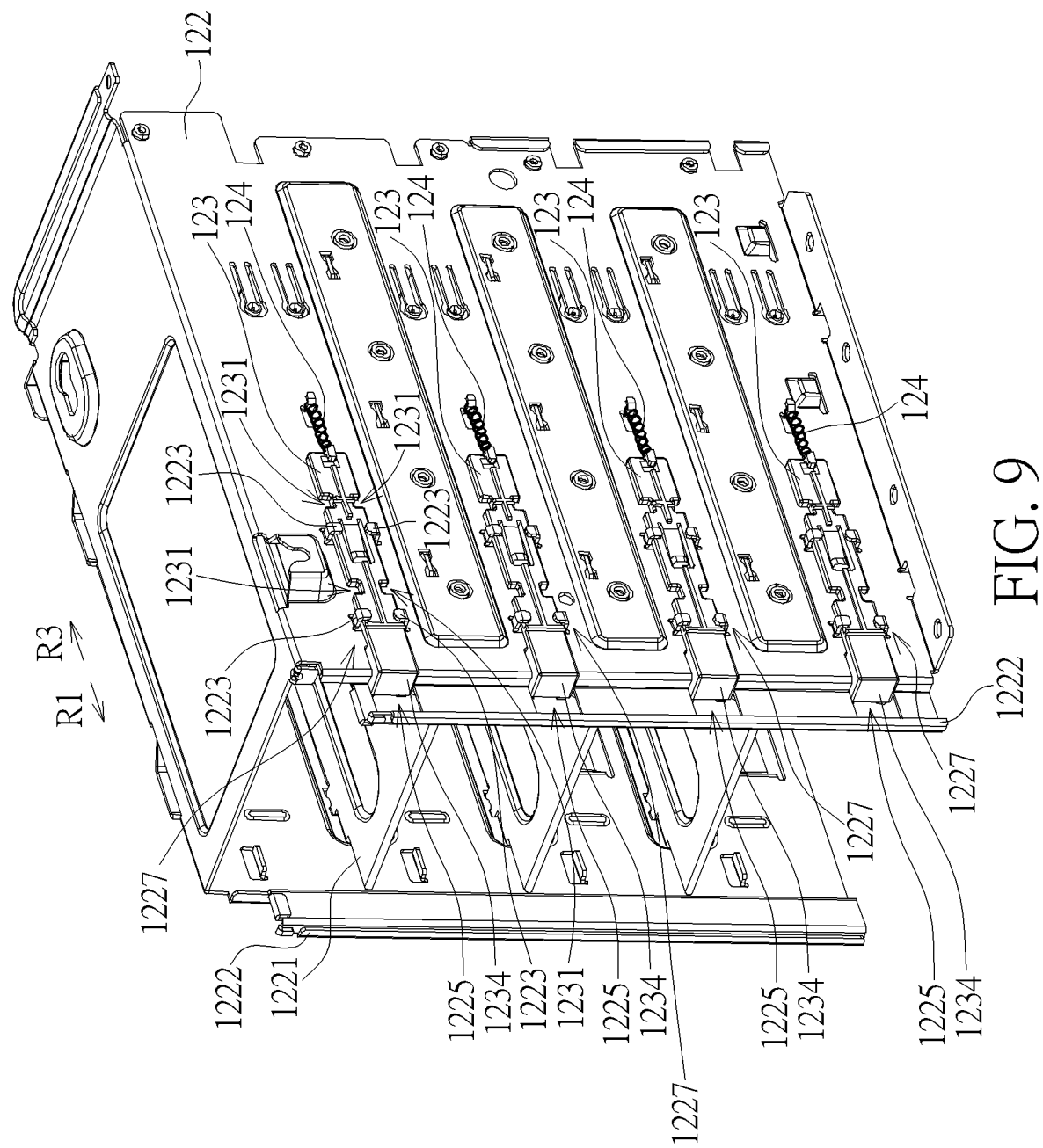
FIG. 9 and FIG. 10 are diagrams of the cage where the restraining component is installed at different views according to the embodiment of the present disclosure.
Figure 10:
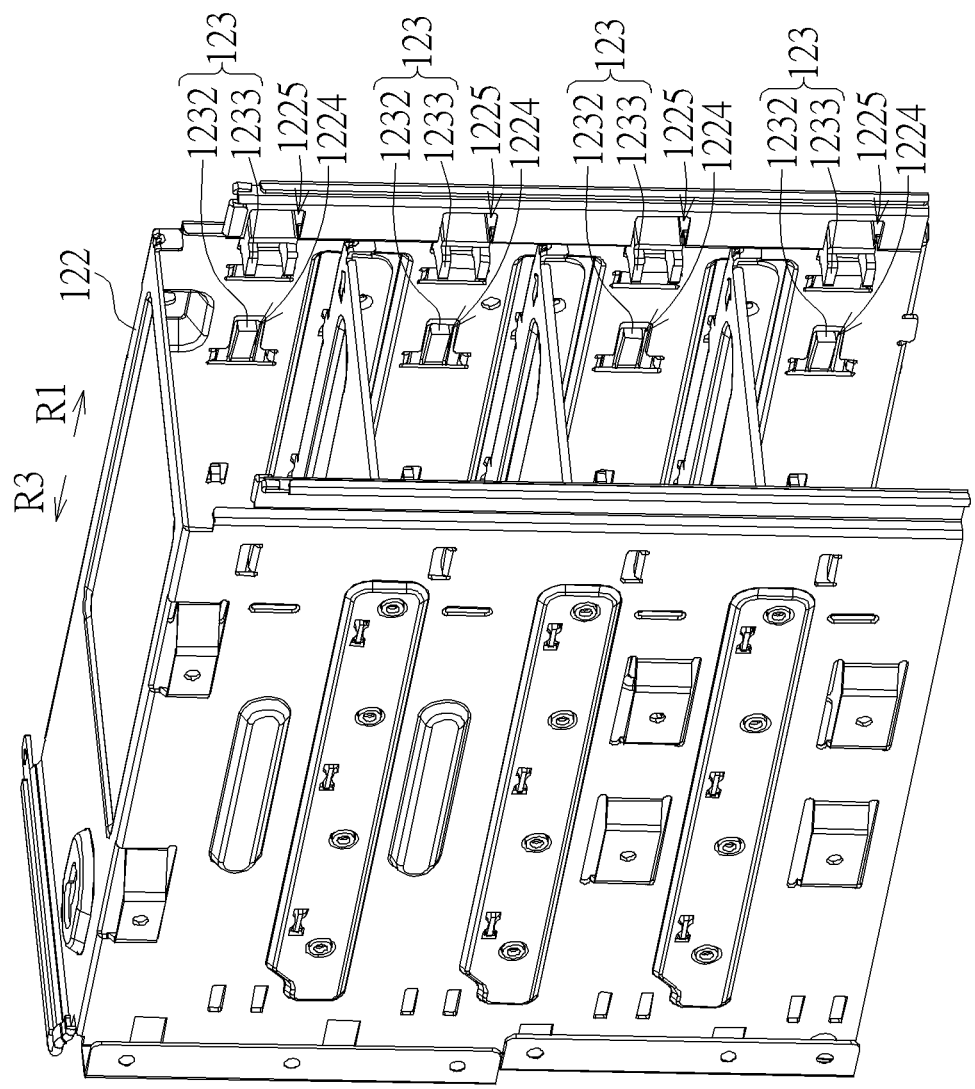

Please refer to FIG. 1 to FIG. 10. FIG. 7 and FIG. 8 are diagrams of the restraining component 123 at different views according to the embodiment of the present disclosure. FIG. 9 and FIG. 10 are diagrams of the cage 122 where the restraining component 123 is installed at different views according to the embodiment of the present disclosure. As shown in FIG. 1 to FIG. 10, each restraining component 123 is movably disposed on the cage 122 and can move relative to the cage 122 between the restraining position as shown in FIG. 1 and the releasing position as shown in FIG. 2 along the first direction R1 or the third direction R3. When the restraining component 123 is located at the restraining position, the restraining component 123 can stop the second electronic module 14, so that the second electronic module 14 can be restrained from moving relative to the cage 122 to the second installing position along the second direction R2 or from moving away from the second installing position along the fourth direction R4. On the other hand, when the restraining component 123 is located at the releasing position, the restraining component cannot stop the second electronic module 14, so that the second electronic module 14 can move relative to the cage 122 to the second installing position along the second direction R2 or can move away from the second installing position along the fourth direction R4.

Specifically, each restraining component 123 is movably disposed on an outer side of the cage 122. Four fixing assemblies 1227 are formed on the cage 122 and located at positions corresponding to the four restraining components 123. Each fixing assembly 1227 includes four fixing lugs 1223 protruding from the cage 122. Four recesses 1231 are formed on the corresponding four restraining components 123 and located at positions corresponding to the four fixing lugs 1223, respectively. Each restraining component 123 is movably disposed on the cage 122 by cooperation of the four fixing lugs 1223 and the four recesses 1231. Furthermore, four sliding slots 1224 are formed on the cage 122. Each restraining component 123 includes a sliding stopping portion 1232 located at a position corresponding to the corresponding sliding slot 1224. The sliding stopping portion 1232 of each restraining component 123 is slidably disposed in the corresponding sliding slot 1224 when each restraining component 123 is movably disposed on the cage 122. The sliding stopping portion 1232 of each restraining component 123 is for abutting against a wall of the corresponding sliding slot 1224 for restraining a sliding displacement of each restraining component 123, so that each restraining component 123 can be positioned at the restraining position by abutment of the sliding stopping portion 1232 and the wall of the corresponding sliding slot 1224 and can be prevented from falling off due to alignment of the recesses 1231 and the fixing lugs 1223 during a movement of each restraining component 123. Preferably, in this embodiment, the sliding stopping portion 1232 can be a resilient arm with an inclined surface. The resilient arm can be resiliently deformed during installation or detachment of the restraining component 123 for bringing convenience in the installation or the detachment of the restraining component 123. Furthermore, the numbers, the shapes and the configurations of the fixing assembly, the fixing lug, the recess and the sliding slot are not limited to this embodiment, and it depends on practical demands. For example, in another embodiment, there can be only one sliding slot formed on the cage and two fixing lug protruding from the cage and opposite to each other.

Besides, four through slots 1225 are formed on the cage 122. Each restraining component 123 includes a driving portion 1233. The driving portion 1233 passes through the corresponding through slot 1225 to protrude from an inner side of the cage 122 for contacting the corresponding first electronic module 13. When the corresponding first electronic module 13 is installed on the cage 122 and moves relative to the cage 122 toward the first installing position along the first direction R1, the driving portion 1233 contacts the corresponding first electronic module 13, so that the each restraining component 123 can be driven by the corresponding first electronic module 13 to move relative to the cage 122 to the restraining position along the first direction R1. Furthermore, preferably, in this embodiment, the case module 12 further includes four recovering components 124. Each recovering component 124 is connected to the corresponding restraining component 123 and the cage 122, so that the corresponding restraining component 123 can be biased to move to the releasing position. In other words, when the first electronic module 13 moves relative to the cage 122 away from the first installing position along the third direction R3, the recovering component 124 drives the restraining component 123 to recover to the releasing position along the third direction R3. However, the shape and the configuration of the driving portion and the numbers, the shapes and the configuration of the through slot and the recovering component are not limited to this embodiment, and it depends on practical demands. For example, in another embodiment, the first electronic module can include a protruding structure protruding from an outer side of the cage. The driving portion can be a protruding rib or a protruding block which is located outside the cage and for contacting with the protruding structure. Alternatively, in another embodiment, the case module can include only one recovering component, and there can be only one through slot formed on the cage.

In addition, each restraining component 123 further includes a stopping portion 1234. The second electronic module 14 includes four engaging portions 144 and an abutting portion 145. When the restraining component 123 is driven by the corresponding first electronic module 13 to the restraining position, the stopping portion 1234 of the restraining component 123 can contact with the abutting portion 145 during movement of the second electronic module 14 along the second direction R2 toward the second installing position (but the second electronic module 14 has not been positioned at the second installing position yet) for preventing the second electronic module 14 from reaching the second installing position, or the stopping portion 1234 of the restraining component 123 can engage with the corresponding engaging portion 144 of the second electronic module 14 located at the second installing position for preventing the second electronic module 14 from moving away from the second installing position along the fourth direction R4. Preferably, in this embodiment, the stopping portion 1234 can be a protruding block. The engaging portion 144 can be a notch. The abutting portion 145 can be a protruding structure. However, the present disclosure is not limited to this embodiment. Furthermore, the numbers, the shapes and the configurations of the stopping portion and the engaging portion are not limited to those illustrated in the figures of this embodiment, and it depends on practical demands. Besides, preferably, in this embodiment, the restraining component 123 can be made of plastic material to have structural flexibility to facilitate a user to install the restraining component 123 on the cage 122 and reduce an impact force for providing a shock-absorbing effect when the stopping portion 1234 contacts with the abutting portion 145.

Figure 11:
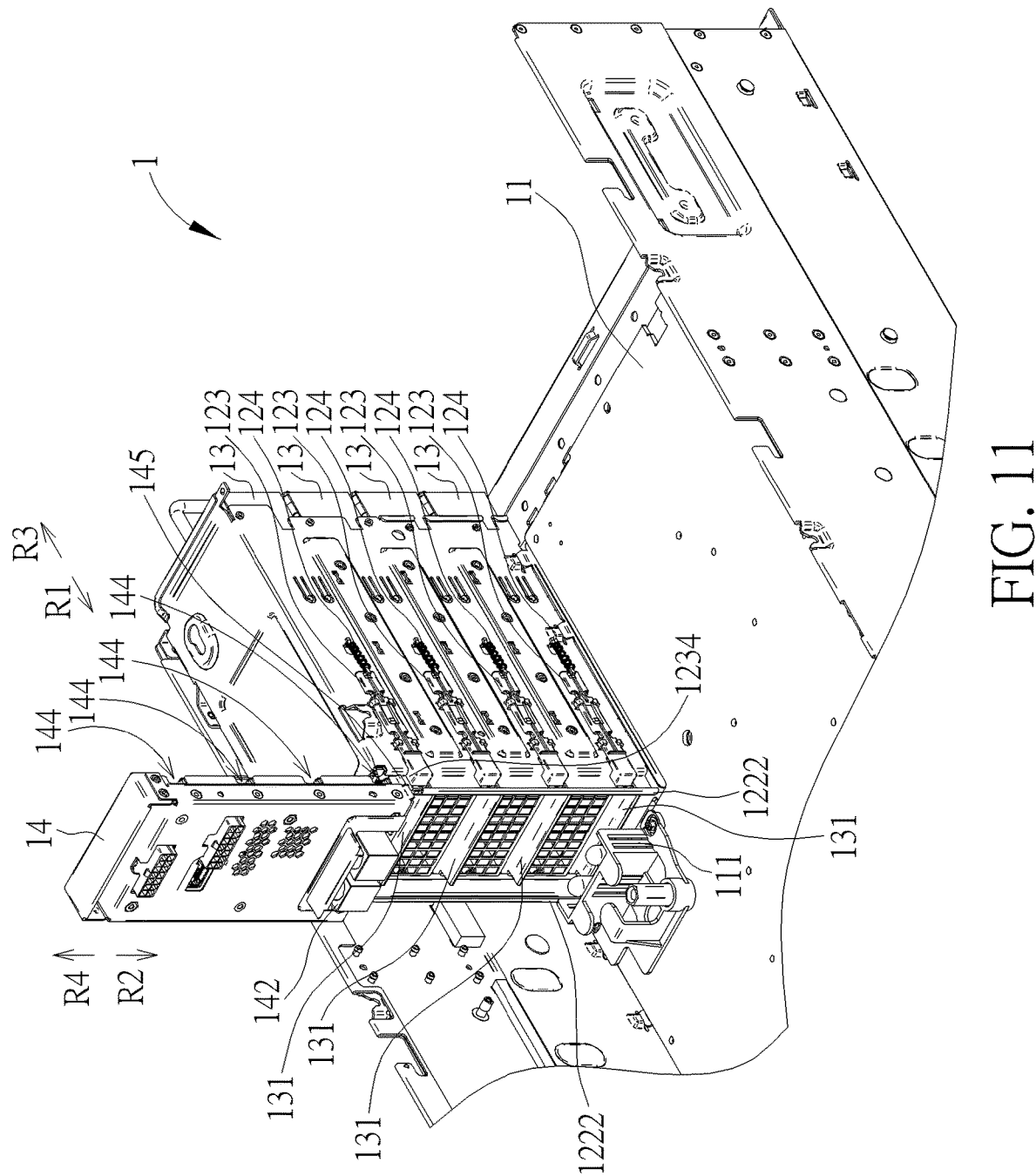
FIG. 11 and FIG. 12 are diagrams of the electronic device in different states according to the embodiment of the present disclosure.
Figure 12:
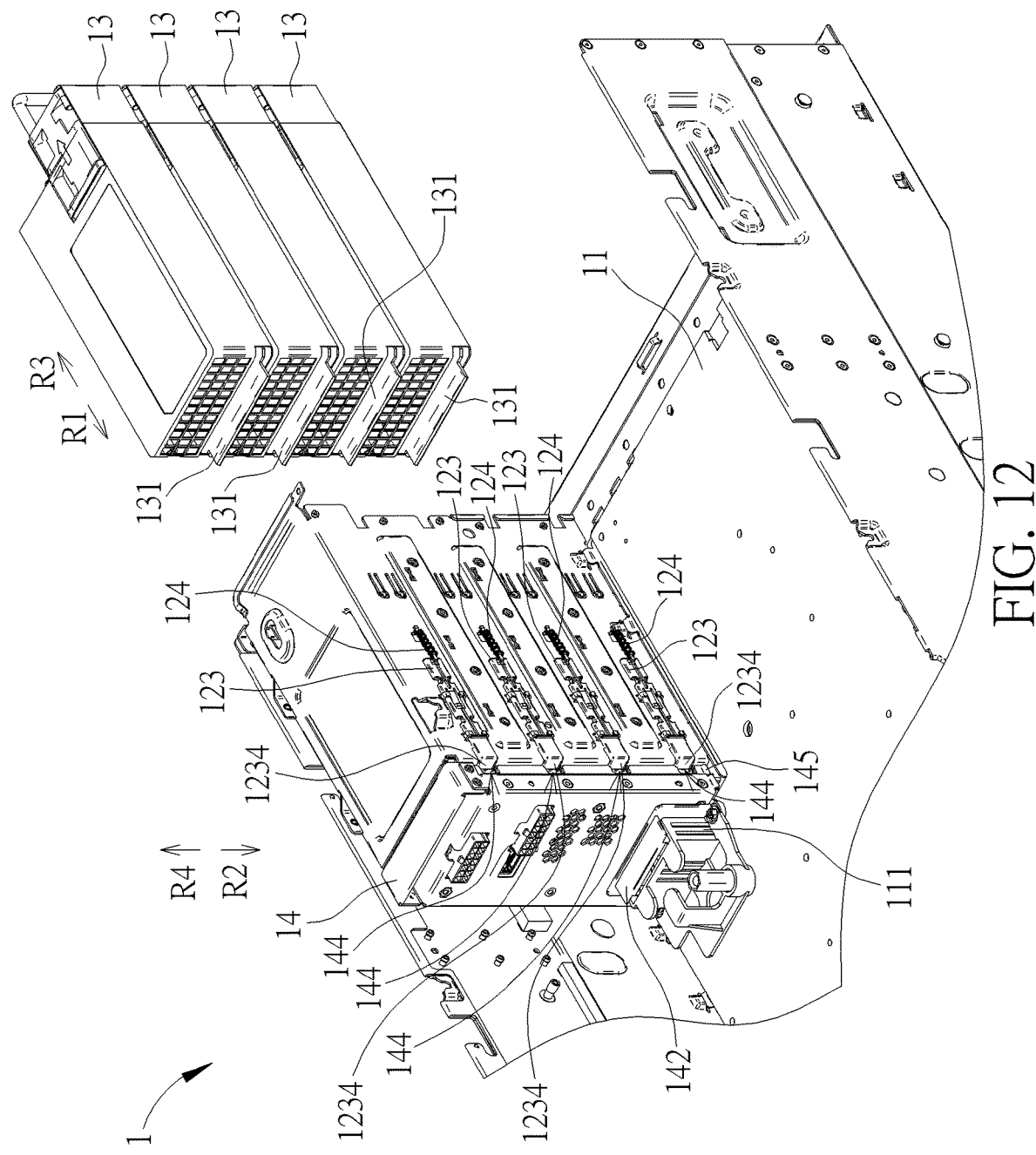

Please refer to FIG. 1 to FIG. 12. FIG. 11 and FIG. 12 are diagrams of the electronic device 1 in different states according to the embodiment of the present disclosure. When it is desired to install the first electronic module 13 and the second electronic module 14 on the cage 122, it has to install the second electronic module 14 before the first electronic module 13. As shown in FIG. 12, when the second electronic module 14 is installed on the cage 122 and moves relative to the cage 122 toward the second installing position along the second direction R2 on a condition that the first electronic module 13 is not installed at the first installing position, the restraining component 123 is driven by the recovering component 124 to be located at the releasing position instead of the restraining position. Therefore, during the aforementioned movement of the second electronic module 14 toward the second installing position along the second direction R2, the stopping portion 1234 does not contact with the abutting portion 145 of the second electronic module 14 to allow the second electronic module 14 to reach the second installing position for mating the third electrical connector 142 of the second electronic module 14 with the fourth electrical connector 111 of the circuit board 11.

On the other hand, if the first electronic module 13 is installed on the cage 122 and moved to the first installing position before installation of the second electronic module 14, the restraining component 123 is moved by the first electronic module 13 to the restraining position, so that the stopping portion 1234 can contact with the abutting portion 145 of the second electronic module 14 during the movement of the second electronic module 14 toward the second installing position for preventing the second electronic module 14 from reaching the second installing position as shown in FIG. 11, so as to prevent collision of components of the second electronic module 14, e.g., the second electrical connector 141, and components of the first electronic module 13, e.g., the first electrical connector 131, during the movement of the second electronic module 14 toward the second installing position, which can protect the second electrical connector 141 or the first electrical connector 131 from being damaged by a shear force in the collision.

Afterwards, when the first electronic module 13 is installed on the cage 122 and moves relative to the cage 122 to the first installing position along the first direction R1 after the installation of the second electronic module 14, the first electronic module 13 contacts with the driving portion 1233 of the restraining component 123, so that the restraining component 123 is driven by the first electronic module 13 to move from the releasing position to the restraining position. When the first electronic module 13 reaches the first installing position, the first electrical connector 131 of the first electronic module 13 is mated with the second electrical connector 141 of the second electrical connector 14, and the restraining component 123 is driven to move to the restraining position to engage the stopping portion 1234 with the engaging portion 144 of the second electronic module 14, i.e., the electronic device 1 is in a state shown in FIG. 1. At this moment, since the second electronic module 14 is stopped by the restraining component 123 from moving away from the second installing position along the fourth direction R4, the first electrical connector 131 and the second electrical connector 141 which are mated with each other can be prevented from being damaged by an external force along the fourth direction R4 or the second direction R2.

Moreover, as mentioned above, when the second electronic module 14 and the first electronic module 13 are respectively located at the second installing position and the first installing position, the stopping portion 1234 of the restraining component 123 engages with the engaging portion 144 of the second electronic module 14, so as to stop the second electronic module 14 from moving relative to the cage 122 away from the second installing position along the fourth direction R4 for preventing damage of the first electrical connector 131 and the second electrical connector 141. Therefore, when it is desired to disassemble the first electronic module 13 and the second electronic module 14 from the cage 122, the first electronic module 13 has to be detached before the second electronic module 14. When the first electronic module 13 moves relative to the cage 122 along the third direction R3 to leave from the first installing position, the restraining component 123 is driven by the recovering component 124 to move from the restraining position to the releasing position, so as to disengage the stopping portion 1234 of the restraining component 123 from the engaging portion 144 of the second electronic module 14 for allowing the second electronic module 14 to move relative to the cage 122 along the fourth direction R4 to leave from the second installing position and then be detached from the cage 122. In other words, the detachment of the first electronic module 13 needs to be accomplished before detachment of the second electronic module 14, and it can prevent the first electrical connector 131 of the first electronic module 13 and the second electrical connector 141 of the second electronic module 14 which are mated with each other from being damaged by a shear force along the second direction R2 or the fourth direction R4 substantially perpendicular to a mating direction.

In contrast to the prior art, the present invention can effectively utilize an internal space of the case module by installing the first electronic module and the second electronic module on the cage along different directions. Therefore, the present invention has a better space utilization. Besides, the present invention further utilizes the restraining component which can be driven by the first electronic module to move between the restraining position for stopping the second electronic module, and the releasing position for not stopping the second electronic module. If the user would like to install the first electronic module on the cage and move the first electronic module to the first installing position along the first direction before installing the second electronic module to the second installing position, the restraining component which is driven by the first electronic module to move to the restraining position can stop the second electronic module during the movement of the second electronic module relative to the cage toward the second installing position along the second direction, so that the second electronic module can be restrained from contacting with the first electronic module for preventing collision of components of the first electronic module, e.g., the first electrical connector, and the components of the second electronic module, e.g., the second electrical connector. In other words, the present invention only allows the user to complete the installation of the second electronic module before installation of the first electronic module. Furthermore, if the user would like to detach the second electronic module from the cage before detachment of the first electronic module, the restraining component at the restraining position also can stop the second electronic module to restrain the second electronic module from moving away from the second installing position along the fourth direction for preventing the first electrical connector and the second electrical connector which are mated with each other from being damaged by an external force. In other words, the present invention only allows the user to complete detachment of the first electronic module before detachment of the second electronic module. That is, the present invention can effectively prevent the first electronic module or the second electronic module from being damaged by a collision due to an operational mistake during installation or detachment.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device capable of installing different modules, the electronic device comprising:
   a case module comprising:
      a cage; and
      at least one restraining component movably disposed on the cage and movable relative to the cage to a restraining position along a first direction, each of the at least one restraining component being integrally formed as a single entity;
   at least one first electronic module detachably installed on the cage and movable relative to the cage to a first installing position along the first direction; and
   a second electronic module detachably installed on the cage and movable relative to the cage to a second installing position along a second direction perpendicular to the first direction;
   wherein the at least one restraining component is driven by the at least one first electronic module to move to the restraining position when the at least one first electronic module moves to the first installing position along the first direction, and the second electronic module is stopped by the at least one restraining component at the restraining position.

2. The electronic device of claim 1, wherein the at least one restraining component comprises a driving portion, and when the at least one first electronic module is installed on the cage and moves relative to the cage toward the first installing position along the first direction, the driving portion contacts the at least one first electronic module, so that the at least one restraining component is driven by the at least one first electronic module to move toward the restraining position.

3. The electronic device of claim 1, wherein the second electronic module comprises an abutting portion, the at least one restraining component comprises a stopping portion, when the second electronic module has not yet been installed on the cage, the at least one restraining component is allowed to be moved to the restraining position by the at least one first electronic module to allow the stopping portion to contact the abutting portion during movement of the second electronic module to the second installing position along the second direction for preventing the second electronic module from reaching the second installing position along the second direction.

4. The electronic device of claim 1, wherein the second electronic module comprises at least one engaging portion, the at least one restraining component comprises a stopping portion, when the second electronic module is installed on the cage and moves relative to the cage to the second installing position along the second direction, the at least one restraining component is allowed to be moved to the restraining position by the at least one first electronic module to engage the stopping portion with the at least one engaging portion for preventing the second electronic module from leaving from the second installing position along a direction opposite to the second direction.

5. The electronic device of claim 1, wherein the cage further comprises at least one first guiding component, the second electronic module comprises at least one second guiding component, and the second electronic module is guided by cooperation of the at least one first guiding component and the at least one second guiding component to move relative to the cage along the second direction.

6. The electronic device of claim 5, wherein the at least one first guiding component is a guiding track, the at least one second guiding component is a guiding slot, the guiding slot comprises a slot portion and a diverging opening portion connected to the slot portion and for guiding the guiding track to enter into the slot portion.

7. The electronic device of claim 1, wherein the case module further comprises at least one recovering component connected to the at least one restraining component and the cage.

8. The electronic device of claim 1, wherein a plurality of fixing lugs protrudes from the cage, a plurality of recesses is formed on the at least one restraining component and located at a position corresponding to the plurality of fixing lugs, and the at least one restraining component is movably disposed on the cage by cooperation of the plurality of fixing lugs and the plurality of recesses.

9. The electronic device of claim 1, wherein at least one sliding slot is formed on the cage, the at least one restraining component comprises a sliding stopping portion located at a position corresponding to the at least one sliding slot, the sliding stopping portion is slidably disposed in the at least one sliding slot when the at least one restraining component is movably disposed on the cage, and the sliding stopping portion is for abutting against a wall of the at least one sliding slot for restraining a sliding displacement of the at least one restraining component.

10. The electronic device of claim 1, further comprising a circuit board, the at least one first electronic module comprises a first electrical connector, the second electronic module comprises at least one second electrical connector and a third electrical connector, the circuit board comprises a fourth electrical connector, and the first electrical connector and the third electrical connector are respectively connected to the at least one second electrical connector and the fourth electrical connector when the at least one first electronic module and the second electronic module are respectively located at the first installing position and the second installing position.

11. The electronic device of claim 1, wherein the second electronic module comprises an abutting portion and at least one engaging portion, the at least one restraining component comprises a stopping portion, when the second electronic module has not yet been installed on the cage, the at least one restraining component is allowed to be moved to the restraining position by the at least one first electronic module to allow the stopping portion to contact the abutting portion during movement of the second electronic module relative to the cage toward the second installing position along the second direction for preventing the second electronic module from reaching the second installing position along the second direction, and when the second electronic module is installed on the cage and moves relative to the cage to the second installing position along the second direction, the at least one restraining component is allowed to be moved to the restraining position by the at least one first electronic module to engage the stopping portion with the at least one engaging portion for preventing the second electronic module from leaving from the second installing position along a direction opposite to the second direction.

12. A case module for disposing at least one first electronic module and a second electronic module, the case module comprising:
   a cage; and
   at least one restraining component movably disposed on the cage and movable relative to the cage to a restraining position along a first direction, each of the at least one restraining component being integrally formed as a single entity, the at least one first electronic module and the second electronic module being detachably installed on the cage, the at least one first electronic module being movable relative to the cage to a first installing position along the first direction, the second electronic module being movable relative to the cage to a second installing position along a second direction perpendicular to the first direction;
   wherein the at least one restraining component is driven by the at least one first electronic module to move to the restraining position when the at least one first electronic module moves to the first installing position along the first direction, and the second electronic module is stopped by the at least one restraining component at the restraining position.

13. The case module of claim 12, wherein the at least one restraining component comprises a driving portion, and when the at least one first electronic module is installed on the cage and moves relative to the cage toward the first installing position along the first direction, the driving portion contacts the at least one first electronic module, so that the at least one restraining component is driven by the at least one first electronic module to move toward the restraining position.

14. The case module of claim 12, wherein the at least one restraining component comprises a stopping portion, when the second electronic module has not yet been installed on the cage, the at least one restraining component is allowed to be moved to the restraining position by the at least one first electronic module to allow the stopping portion to contact an abutting portion of the second electronic module during movement of the second electronic module to the second installing position along the second direction for preventing the second electronic module from reaching the second installing position along the second direction.

15. The case module of claim 12, wherein the at least one restraining component comprises a stopping portion, when the second electronic module is installed on the cage and moves relative to the cage to the second installing position along the second direction, the at least one restraining component is allowed to be moved to the restraining position by the at least one first electronic module to engage the stopping portion with at least one engaging portion of the second electronic module for preventing the second electronic module from leaving from the second installing position along a direction opposite to the second direction.

16. The case module of claim 12, wherein the cage further comprises at least one first guiding component for guiding the second electronic module to move relative to the cage along the second direction.

17. The case module of claim 12, further comprising at least one recovering component connected to the at least one restraining component and the cage.

18. The case module of claim 12, wherein a plurality of fixing lugs protrudes from the cage, a plurality of recesses is formed on the at least one restraining component and located at a position corresponding to the plurality of fixing lugs, and the at least one restraining component is movably disposed on the cage by cooperation of the plurality of fixing lugs and the plurality of recesses.

19. The case module of claim 12, wherein at least one sliding slot is formed on the cage, the at least one restraining component comprises a sliding stopping portion located at a position corresponding to the at least one sliding slot, the sliding stopping portion is slidably disposed in the at least one sliding slot when the at least one restraining component is movably disposed on the cage, and the sliding stopping portion is for abutting against a wall of the at least one sliding slot for restraining a sliding displacement of the at least one restraining component.

20. The case module of claim 12, wherein the at least one restraining component comprises a stopping portion, when the second electronic module has not yet been installed on the cage, the at least one restraining component is allowed to be moved to the restraining position by the at least one first electronic module to allow the stopping portion to contact an abutting portion of the second electronic module during movement of the second electronic module relative to the cage toward the second installing position along the second direction for preventing the second electronic module from reaching the second installing position along the second direction, and when the second electronic module is installed on the cage and moves relative to the cage to the second installing position along the second direction, the at least one restraining component is allowed to be moved to the restraining position by the at least one first electronic module to engage the stopping portion with at least one engaging portion of the second electronic module for preventing the second electronic module from leaving from the second installing position along a direction opposite to the second direction.

\* \* \* \* \*